(12) United States Patent
Tian et al.

(10) Patent No.: US 11,441,847 B2
(45) Date of Patent: Sep. 13, 2022

(54) EVAPORATIVE COOLING SYSTEM

(71) Applicant: Lenovo (Beijing) Co., Ltd., Beijing (CN)

(72) Inventors: Ting Tian, Beijing (CN); Lianpei Zhang, Beijing (CN)

(73) Assignee: LENOVO (BEIJING) CO., LTD., Beijing (CN)

( * ) Notice: Subject to any disclaimer, the term of this patent is extended or adjusted under 35 U.S.C. 154(b) by 183 days.

(21) Appl. No.: 16/359,560

(22) Filed: Mar. 20, 2019

(65) Prior Publication Data

US 2019/0293356 A1 Sep. 26, 2019

(30) Foreign Application Priority Data

Mar. 20, 2018 (CN) .......................... 201810230445.7

(51) Int. Cl.
  *F28D 15/02* (2006.01)
  *F25B 39/02* (2006.01)
  *H01L 23/427* (2006.01)

(52) U.S. Cl.
  CPC ........ *F28D 15/0233* (2013.01); *F25B 39/022* (2013.01); *F28D 15/0275* (2013.01); *H01L 23/427* (2013.01)

(58) Field of Classification Search
  CPC .............. F25B 39/022; F28D 15/0233; F28D 15/0275; H01L 23/427
  USPC ....................................... 165/104.33, 104.26
  See application file for complete search history.

(56) References Cited

U.S. PATENT DOCUMENTS

| | | | | |
|---|---|---|---|---|
| 8,164,902 B2 * | 4/2012 | Matsushima | ...... | H05K 7/20809 361/700 |
| 8,295,047 B1 * | 10/2012 | Hamburgen | ....... | H05K 7/20827 361/699 |
| 2008/0314565 A1 * | 12/2008 | Martin | .................. | H01L 23/427 165/104.33 |
| 2010/0277863 A1 * | 11/2010 | Tozer | ................. | H05K 7/20827 361/679.47 |
| 2011/0198057 A1 * | 8/2011 | Lange | ................. | F28D 15/0266 165/104.26 |
| 2014/0293541 A1 * | 10/2014 | Opila | ........................ | F28F 1/32 361/697 |

(Continued)

FOREIGN PATENT DOCUMENTS

CN  101242729 A  8/2008
CN  104121645 A  10/2014

(Continued)

*Primary Examiner* — Joel M Attey
(74) *Attorney, Agent, or Firm* — Anova Law Group, PLLC

(57) ABSTRACT

An evaporative cooling system having a heat conducting device, the heat conducting device being capable of coupling to a heating element to be cooled and the heat conducting device comprising a first medium; a heat dissipating device having one or more heat dissipating outlets; and an evaporator disposed in the heat dissipating device and arranged in relation to the heat conducting device that is arranged at least partially outside the heat dissipating device. The heat dissipating device comprises a second medium, and the evaporator is configured to receive heat from the heat conducting device to heat the second medium of the heat dissipating device and discharge the heat from the one or more heat dissipating outlets of the heat dissipating device.

13 Claims, 4 Drawing Sheets

(56) References Cited

U.S. PATENT DOCUMENTS

| | | | |
|---|---|---|---|
| 2015/0034270 A1* | 2/2015 | Kim | F28D 15/0266 165/11.1 |
| 2017/0234623 A1* | 8/2017 | Fried | H05K 7/20809 165/104.26 |
| 2018/0035569 A1 | 2/2018 | Harrington | |
| 2019/0107332 A1* | 4/2019 | Rede | F28F 25/04 |

FOREIGN PATENT DOCUMENTS

| | | |
|---|---|---|
| CN | 105444446 A | 3/2016 |
| CN | 105485630 A | 4/2016 |
| CN | 205655422 U | 10/2016 |
| CN | 106949653 A | 7/2017 |

\* cited by examiner (a) an S-shaped structure (b) a grid structure (c) a plate structure (d) a honeycomb structure

EVAPORATIVE COOLING SYSTEM

CROSS-REFERENCES TO RELATED APPLICATIONS

This application claims the priority to Chinese Patent Application No. 201810230445.7, entitled "Evaporative Cooling System," filed on Mar. 20, 2018, the entire content of which is incorporated herein by reference.

FIELD OF TECHNOLOGY

The present disclosure relates to the field of thermal management. More specifically, the present disclosure relates to an evaporative cooling system.

BACKGROUND

With the increase in dissipated energy density and global energy shortage, low energy efficiency has become a pain point of data centers. Statistically, energy used for server cooling accounts for half of the energy consumption of traditional data centers, and some are even higher.

Currently, the well-adopted server room cooling methods include the conventional server room water cooling method and the conventional water-cooled door method.

The conventional server room water cooling method often includes two liquid circulations. In the indoor circulation, cold water flows into the server rack to absorb the heat, the heat is exchanged with the outdoor circulation using the cooling distribution unit (CDU), and the exchanged heat in the outdoor circulation is distributed to the outside environment using outdoor equipment.

The conventional water-cooled door method is similar to the conventional server room water cooling method, which also includes two liquid circulations to distribute the heat to the outside environment. This type of cooling requires complex piping and outdoor equipment design.

The liquid cooling solution can produce significant saving in power consumption of the air conditioning system and effectively improve energy efficiency. However, liquid cooling solutions usually involve complex piping designs and have high requirements for data center infrastructure, hence implementing or expanding the liquid cooling solution becomes more difficult with higher risks for existing data centers. Further, conventional liquid cooling solutions also require heat to be exchanged from the data center to the outside world using large and complex outdoor equipment that are expensive to purchase and operate. Furthermore, limited heat emission space and noise restrictions also make the liquid cooling solution difficult to implement.

In addition to the challenges set forth above, the conventional water-cooled door method also faces challenges such as requiring low temperature inlet water and high-speed fans. In the conventional water-cooled rack door method, the temperature of the inlet water is typically below 18° C., which requires the inlet water to be processed. This increases energy consumption and requires additional support equipment such as water cooling machines. Further, the cooling inside the rack is still done using air cooling, which requires the use of high-speed fans to perform heat exchange between the hot air and the water-cooled door, and the high-speed fans have low cooling efficiency.

With the challenges set forth above, a solution to increase the energy efficiency of the data centers while simplifying the implementation and operation of such solution is needed.

BRIEF SUMMARY OF THE DISCLOSURE

Embodiments of the present disclosure provide an evaporative cooling system, which can solve the problems of slow heat conduction, high energy consumption, and poor safety of the water-cooled door solution.

One aspect of the present disclosure provides an evaporative cooling system. The system includes a heat conducting device, the heat conducting device being capable of coupling to a heating element to be cooled and the heat conducting device comprising a first medium; a heat dissipating device having one or more heat dissipating outlets; and an evaporator disposed in the heat dissipating device and arranged in relation to the heat conducting device that is arranged at least partially outside the heat dissipating device. The heat dissipating device comprises a second medium, and the evaporator is configured to receive heat from the heat conducting device to heat the second medium of the heat dissipating device and discharge the heat from the one or more heat dissipating outlets of the heat dissipating device.

In one embodiment, the heat conducting device may further include an evaporation chamber and a condensation chamber in communication with each other. The evaporation chamber may be partially in contact or connected to the heating element and may contain the first medium, which may be heated, evaporated, and flown to the condensation chamber. The condensation chamber may be connected to the evaporator, and it may condense the evaporated first medium, and return the liquefied first medium to the evaporation chamber.

In one embodiment, the inner walls of the evaporation chamber and the condensation chamber may include a capillary structure to direct the first medium liquefied in the condensation chamber to the evaporation chamber.

In one embodiment, the heat conducting device may be connected to the evaporator through a heat pipe.

In one embodiment, the evaporator may be structured using one or more of the following structures: an S-shaped structure, a grid structure, a plate structure, and a honeycomb structure.

In one embodiment, the heat dissipating device may further include an importing device to import the second medium into the container.

In one embodiment, the import device may further include a liquid inlet tube extending through the wall of the container and a liquid inlet port formed at the end of the inlet tube in the container.

In one embodiment, the liquid inlet port may further include a spraying device to spray the second medium onto the evaporator.

In one embodiment, the heat dissipating device may further include an exhaust device for providing an airflow to discharge the evaporated second medium.

In one embodiment, the exhaust device may be disposed near the one or more heat dissipating outlets or ports.

In one embodiment, the one or more heat dissipating outlets or ports of the heat dissipating device may be connected to an enclosed channel for discharging the evaporated second medium.

Another aspect of the present disclosure provides an evaporative cooling method including: transferring heat by a heat conducting device, the heat conducting device being capable of coupling to a heating element to be cooled and the heat conducting device comprising a first medium; dissipating heat by a heat dissipating device having one or more heat dissipating outlets; receiving heat by an evaporator disposed in the heat dissipating device and arranged in relation to the heat conducting device that is arranged at least partially outside the heat dissipating device, the heat dissipating device comprises a second medium; and discharging the heat by the evaporator from the one or more heat dissipating outlets of the heat dissipating device.

Another aspect of the present disclosure provides an apparatus. The apparatus includes a cooling system having a heat conducting device, the heat conducting device being capable of coupling to a heating element to be cooled, and heat conducting device comprising a first medium; a heat dissipating device having one or more heat dissipating outlets, and an evaporator disposed in the heat dissipating device and arranged in relation to the heat conducting device that is arranged at least partially outside the heat dissipating device. The heat dissipating device comprises a second medium, and the evaporator is configured to receive heat from the heat conducting device to heat the second medium of the heat dissipating device and discharge the heat from the one or more heat dissipating outlets of the heat dissipating device.

The embodiments of the present disclosure provide an evaporative cooling system having a heat conducting device that is at least partially in contact or connected to a heating element and contains a first medium; a heat dissipating device, which is structured as a container with one or more heat dissipating outlets or ports; and an evaporator disposed in the container and connected to the heat conducting device outside the heat dissipating device. The container contains a second medium in liquid form, and the evaporator receives heat from the heat conducting device to heat the second medium to evaporation, and discharge the heat from the heat dissipating outlets or ports. The system provided in the present disclosure improves the energy efficiency and simplifies the implementation and operations of data center cooling by increasing the heat dissipation efficiency; reducing the energy consumption, fan speed, and noise inside the server room; and eliminating complex pipe and outdoor equipment designs. In embodiments of the present disclosure, the water in the water-cooled door of a server room may be at room temperature, avoiding the need for controlling the inlet water temperature. Hence, the data center may achieve high energy efficiency, future expansion becomes easier to implement, and the safety of the server room is improved.

BRIEF DESCRIPTION OF THE DRAWINGS

For a more complete understanding of the present disclosure, and the advantages thereof, reference is now made to the following descriptions to be taken in conjunction with the accompanying drawings. The accompanying drawings in the following description show merely some embodiments of the present invention, and a person of ordinary skill in the art may still derive other drawings from these accompanying drawings without creative efforts.

DETAILED DESCRIPTION

Hereinafter, aspects, features, and embodiments of the present disclosure will be described with reference to the accompanying drawings. It should be understood that such description is exemplary only but is not intended to limit the scope of the present disclosure. In addition, it will be understood by those skilled in the art that various modifications in form and details may be made therein without departing from the spirit and scope of the present disclosure.

Features and aspects of the present disclosure will become apparent with reference to the accompanying drawings and non-limiting examples describing various preferred embodiments of the present disclosure.

It will also be appreciated that although the present disclosure has been described with reference to some specific examples, equivalents of the present disclosure can be achieved by those skilled in the art. These equivalents having features claimed in the present disclosure should fall within the scope of protection defined hereinafter.

Hereinafter, embodiments of the present disclosure will be described with reference to the accompanying drawings. It should be understood that such description is exemplary only but is not intended to limit the scope of the present disclosure. In addition, in the following description, descriptions of well-known structures and techniques are omitted to avoid unnecessarily obscuring the concepts of the present disclosure. Therefore, specific structural and functional details disclosed herein are not intended to be limiting, but are merely used as a basis of the claims to teach those skilled in the art to use the present disclosure in various combinations.

The terms used herein is for the purpose of describing particular embodiments only but is not intended to limit the present disclosure. The words "a", "an" and "the" as used herein should also cover the meanings of "a plurality of" and "a variety of", unless the context clearly dictates otherwise. In addition, the terms "comprising", "including", "containing" and the like as used herein indicate the presence of the features, steps, operations and/or components, but do not preclude the presence or addition of one or more other features, steps, operations or components.

The phrases "in an embodiment", "in another embodiment", "in another embodiment", or "in other embodiments" may refer to the same or different embodiments accordingly to the present disclosure.

The accompanying drawings illustrating embodiments of the present disclosure along with the summary of disclosure provided above and the detailed description provided below serve to explain the concepts of the present disclosure.

Figure 1:
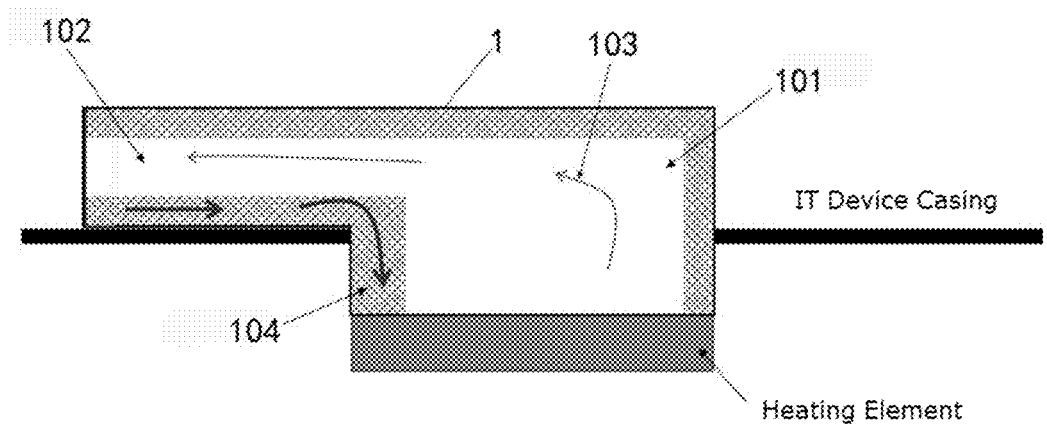
FIG. 1 is a cross-sectional structural view of a Z-shaped evaporation chamber heat conducting plate with of an evaporative cooling system according to an embodiment of the present disclosure.
Figure 2:
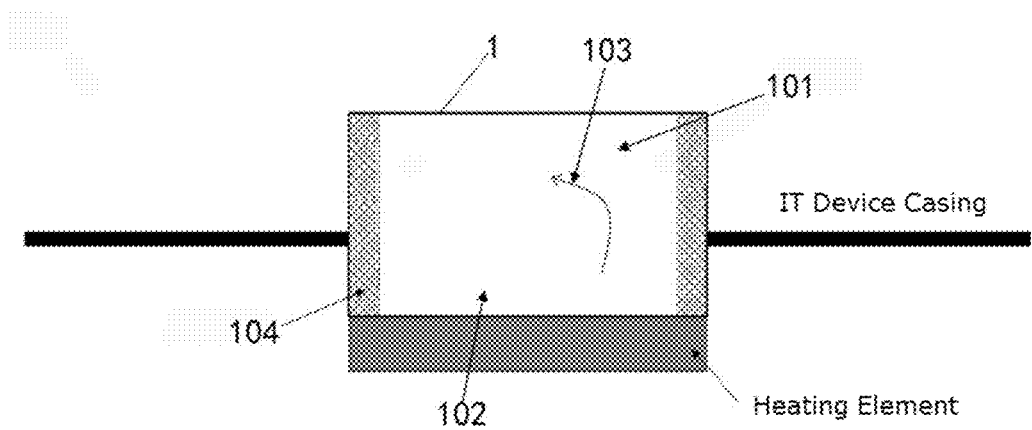
FIG. 2 is a cross-sectional structural view of a cylindrical evaporation chamber heat conducting plate of the evaporative cooling system according to an embodiment of the present disclosure.

Referring to FIG. 1 and FIG. 2. FIG. 1 is a cross-sectional structural view of a Z-shaped evaporation chamber heat conducting plate of an evaporative cooling system according to an embodiment of the present disclosure; and FIG. 2 is a cross-sectional structural view of a cylindrical evaporation chamber heat conducting plate of the evaporative cooling system according to an embodiment of the present disclosure.

In the present embodiment, an evaporation chamber heat conducting plate 1, which may take the form of a Z-shaped structure or a cylindrical structure, includes an evaporation chamber 101 and a condensation chamber 102 in communication with each other. The evaporation chamber 101 may be located in the lower half of the Z-shaped structure or the cylindrical structure, and the condensation chamber 102 may be located in the upper half of the Z-shaped structure or the cylindrical structure. The evaporation chamber 101 may be partially in contact or connected to a heating element to be cooled and contains a first medium 103. The first medium 103 in the evaporation chamber 101 may be in a liquid state. The first medium 103 may be heated, evaporate, and flow to the condensation chamber 102. The condensation chamber 102 may condense the evaporated first medium 103 and return the liquefied first medium 103 to the evaporation chamber 101.

In one embodiment, the inner walls of the evaporation chamber 101 and the condensation chamber 102 may include a capillary structure 104 to direct the first medium 103 liquefied in the condensation chamber 102 to the evaporation chamber 101 to increase the return speed of the liquefied first medium 103. The capillary structure 104 may rapidly guide the condensed first medium 103 in the condensation chamber 102 to the evaporation chamber 101 by capillary wicking, thereby accelerating the phase change cycle of the first medium 103 and increasing heat dissipation effectiveness. The capillary structure 104 may take the form of a sintered layer of copper powder, a groove or a small channel formed by etching, or a wire mesh, but is not limited to these manufacturing methods.

Further, the evaporation chamber 101 may be made of a first heat conducting device and a first thermally non-conductive element. The first heat conducting device may be made of good heat conductive materials such as aluminum or copper, and may be in contact with or connected to a heating element to absorb the heat from the heating element and transfer the heat to the first medium. The first thermally non-conductive element may be made of poor heat conductive materials such as glass or ceramic so heat may be directed to a specified direction, thereby improving the thermal conductivity and the heat transfer efficiency.

Similarly, the condensation chamber 102 may be made of a second heat conducting device and a second thermally non-conductive element. The second heat conducting device may be made of good heat conductive materials such as aluminum or copper, and may transfer the heat carried by the first medium 103 to the outside world. The second thermally non-conductive element may be made of poor heat conductive materials such as glass or ceramic so heat may be directed to a specified direction, thereby improving the thermal conductivity and the heat transfer efficiency.

Figure 3:
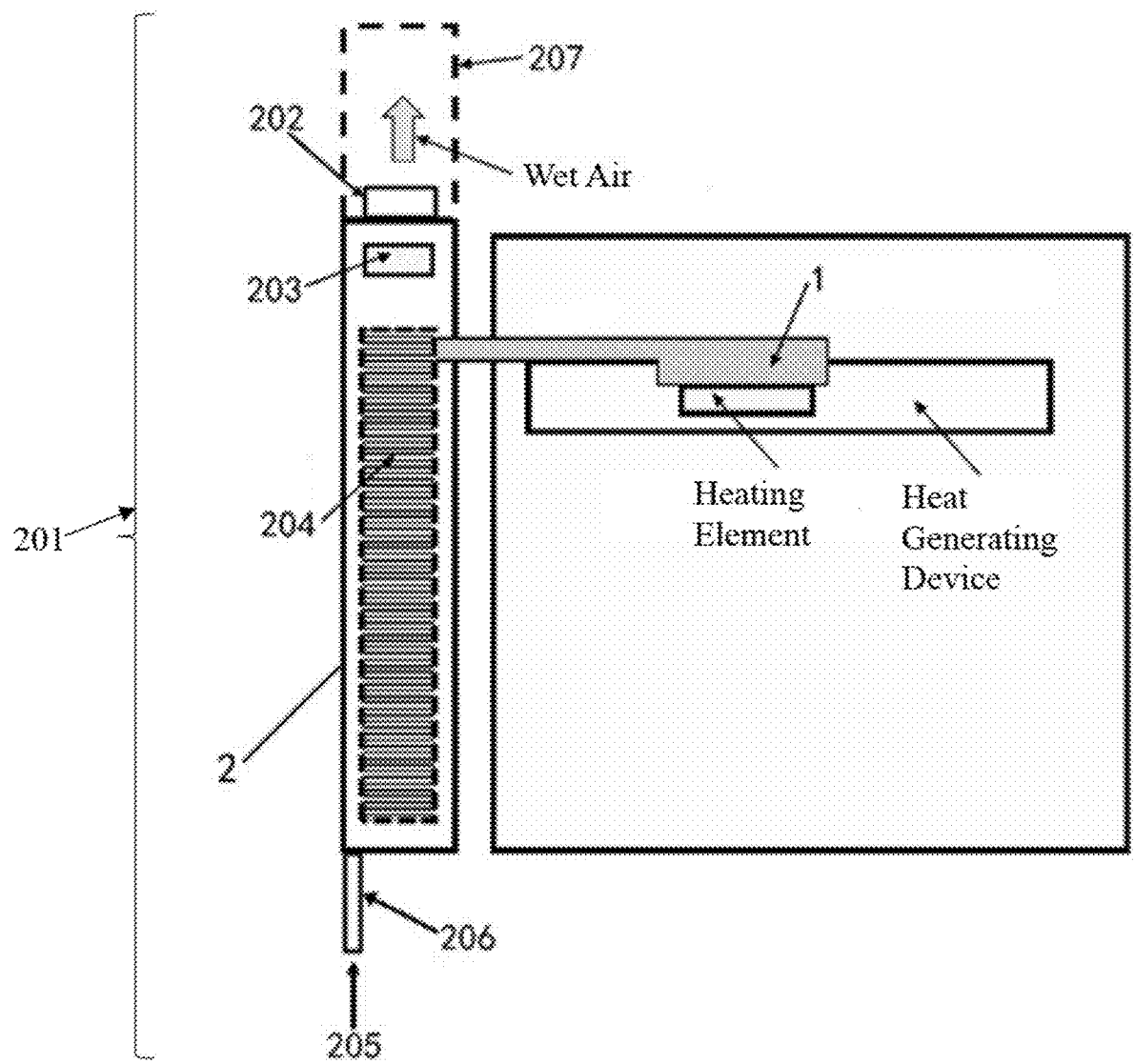
FIG. 3 is a cross-sectional structural view of the evaporative cooling system according to an embodiment of the present disclosure.
Figure 4:
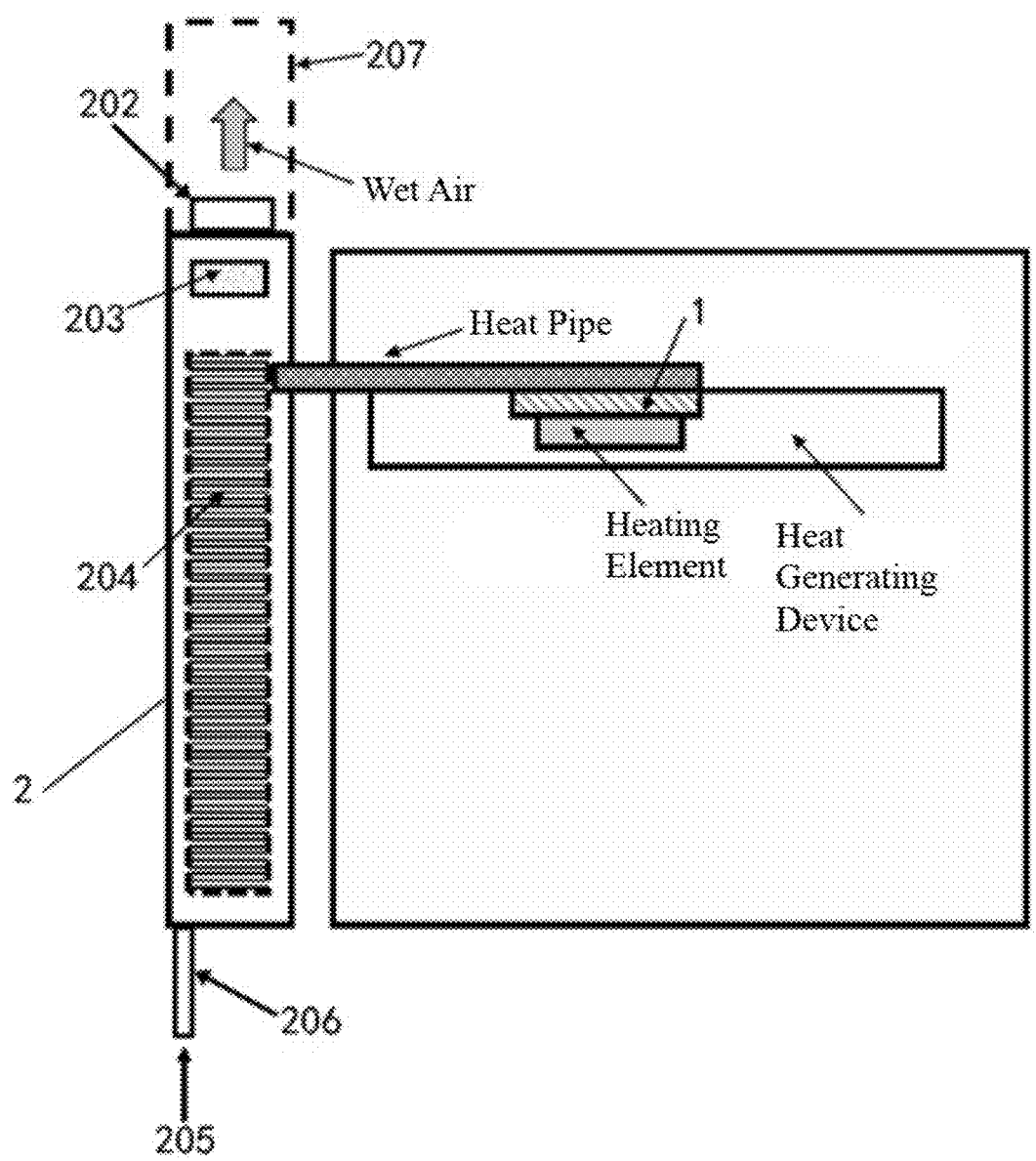
FIG. 4 is a cross-sectional structural view of the evaporative cooling system according to another embodiment of the present disclosure.

Referring to FIG. 3 and FIG. 4. FIG. 3 is a cross-sectional structural view of the evaporative cooling system according to an embodiment of the present disclosure; and FIG. 4 is a cross-sectional structural view of the evaporative cooling system according to another embodiment of the present disclosure.

In the present embodiment, the evaporative cooling system may include a heat dissipating device and an evaporation chamber heat conducting plate.

Figure 5:
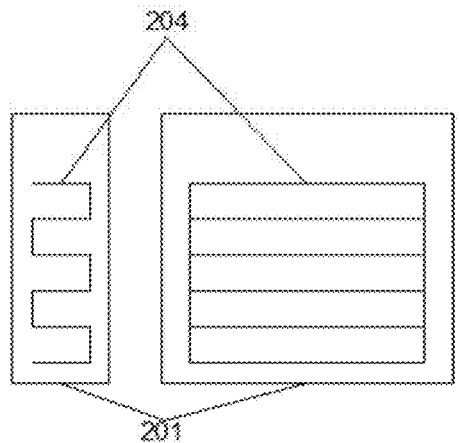
FIG. 5 illustrates a front view and a side view of four structures of an evaporator according to an embodiment of the present disclosure, including: (a) an S-shaped structure; (b) a grid structure; (c) a plate structure; and (d) a honeycomb structure.
Figure 5:
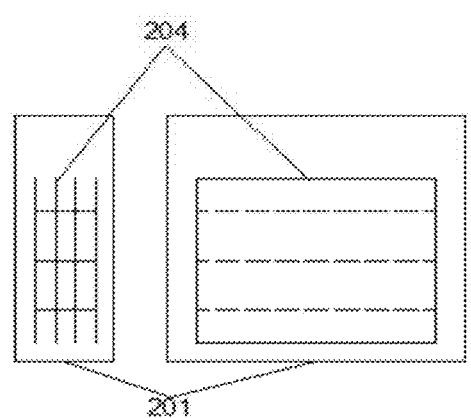
Figure 5:
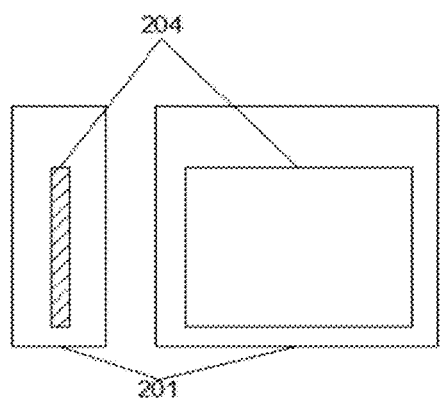
Figure 5:
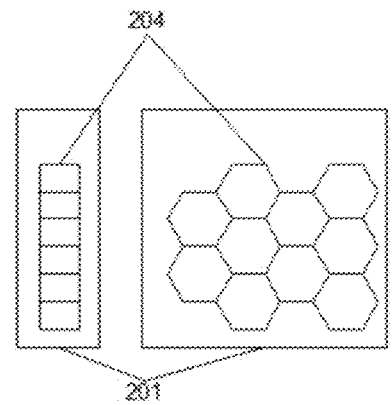

In one embodiment, the heat dissipating device 2 may be a container 201 with one or more heat dissipating outlets or ports 202, for example, several heat dissipating outlets or ports may be placed on top of the container 201. In some embodiments, as shown in FIG. 5 (a)-(d), respectively, the container 201 may further include an evaporator 204, which may be structured using one or more of the following structures: an S-shaped structure, a grid structure, a plate structure, and a honeycomb structure. The evaporator 204 may be connected to the condensation chamber 102 of the evaporation chamber heat conducting plate 1 located outside the heat dissipation element 2. Further, a second medium 205 in a liquid state may be stored in the container 201. The evaporator 204 may receive the heat conducted by the condensation chamber 102 of the evaporation chamber heat conducting plate 1 and evaporate the second medium 205 from the heat dissipating outlets or ports 202.

Referring to FIG. 2. For example, the evaporation chamber 101 of the cylindrical evaporation chamber heat conducting plate 1 is connected or in contact with the heating element of a heat generating device. The evaporation chamber 101 absorbs the heat from the heat element, and transfers the heat to the first medium 103. The first medium 103 moves to the condensation chamber 102 after being evaporated. The condensation chamber 102 is connected to the chassis of the heat generating device, and transfers the heat carried by the evaporated first medium 103 to the surface of the chassis, and then transfers the heat of the surface of the chassis to the evaporator 204 through a heat pipe. The first medium 103 in the condensation chamber 102 releases heat and liquefies, and flows back to the evaporation chamber 101.

In one embodiment, the first heat conducting device of the evaporation chamber 101 may be connected or in contact with the heating element of the heat generating device. The first heat conducting device of the evaporation chamber 101 may absorb the heat from the heat element and transfer the heat to the first medium 103. The first medium 103 may move to the condensation chamber 102 after being evaporated. A second heat conducting device of the condensation chamber 102 may be connected to the chassis of the heat generating device, and may transfer the heat carried by the evaporated first medium 103 to the surface of the chassis, and then transfer the heat of the surface of the chassis to the evaporator 204 through the heat pipe. The first medium 103 in the condensation chamber 102 may release heat, liquefy, and flow back to the evaporation chamber 101.

Referring to FIG. 3. For example, the evaporation chamber 101 of the Z-shaped evaporation chamber heat conducting plate 1 is connected or in contact with the heating element of a heat generating device. The evaporation chamber 101 absorbs the heat from the heat element, and transfers the heat to the first medium 103. The first medium 103 moves to the condensation chamber 102 after being evaporated. The condensation chamber 102 extends outside of the device to the evaporator 204, and transfers the heat carried by the evaporated first medium 103 to the evaporator 204. The first medium 103 in the condensation chamber 102 releases heat and liquefies, and flows back to the evaporation chamber 101.

In one embodiment, the first heat conducting device of the evaporation chamber 101 may be connected or in contact with the heating element of the heat generating device. The first heat conducting device of the evaporation chamber 101 may absorb the heat from the heat element and transfer the heat to the first medium 103. The first medium 103 may move to the condensation chamber 102 after being evaporated. The condensation chamber 102 may extend outside of the device and may be connected to the evaporator 204 through the second heat conducting device, and may transfer the heat carried by the evaporated first medium 103 to the evaporator 204 through the second heat conducting device.

The first medium 103 in the condensation chamber 102 may release heat, liquefy, and flow back to the evaporation chamber 101.

The above embodiments are provided for exemplary purpose, and those skilled in the art can make corresponding changes according to actual situations. However, any technical solution for connecting the evaporation chamber heat conducting plate 1 to the evaporator 204 is included in the protection scope of the present application.

In one embodiment, the heat dissipating device 2 may further include an importing device 206 to import the second medium 205 into the container 201. The import device 206 may further include a liquid inlet tube extending through the wall of the container 201 and a liquid inlet port formed at the end of the inlet tube in the container. Further, the liquid inlet port may further include a spraying device to spray the second medium 205 onto the evaporator 204.

In one embodiment, the heat dissipating device 2 may further include an exhaust device 203 for providing an airflow to discharge the evaporated second medium 205. Further, the exhaust device 203 may be disposed adjacent to the heat dissipating outlets or ports 202. The heat dissipating outlets or ports 202 may connect to an enclosed channel 207 for guiding the evaporated second medium 205, i.e., the wet air, to a discharge area.

Those skilled in the art may clearly understand that, for ease and concision of the descriptions, the aforementioned processing method may be applied to the related electronic devices, and the related details may refer to corresponding descriptions in the disclosed embodiments, which are not repeated herein.

The embodiments in this specification are described in a progressive manner, each embodiment emphasizes a difference from the other embodiments, and the identical or similar parts between the embodiments may be made reference to each other. Since the apparatuses disclosed in the embodiments are corresponding to the methods disclosed in the embodiments, the description of the apparatuses is simple and relevant parts may be made reference to the description of the methods.

Persons skilled in the art may further realize that, units and steps of algorithms according to the description of the embodiments disclosed by the present disclosure can be implemented by electronic hardware, computer software, or a combination of the two. In order to describe interchangeability of hardware and software clearly, compositions and steps of the embodiments are generally described according to functions in the forgoing description. Whether these functions are executed by hardware or software depends upon specific applications and design constraints of the technical solutions. Persons skilled in the art may use different methods for each specific application to implement the described functions, and such implementation should not be construed as a departure from the scope of the present disclosure.

The steps of the methods or algorithms described in the embodiments of the present disclosure may be directly implemented by hardware, software modules executed by the processor, or a combination of both. The software module can be placed in a random access memory (RAM), memory, read only memory (ROM), electrically programmable ROM, electrically erasable and programmable ROM, register, hard disk, mobile disk, CD-ROM, or any other form of storage medium known to the technical domain.

It will be understood by those skilled in the art that the features described in the respective embodiments and/or claims of the present disclosure can be combined in various ways, even if such combinations are not explicitly described in the present disclosure. In particular, without departing from the spirit and teaching of the present disclosure, the features described in the respective embodiments and/or claims can be combined in various ways. All of these combinations fall within the scope of the present disclosure.

While the present disclosure has been shown and described with reference to various embodiments thereof, it will be understood by those skilled in the art that various modifications in form and details may be made therein without departing from the spirit and scope of the present disclosure as defined by the appended claims and their equivalents. Therefore, the scope of the present disclosure should not be limited to the above-described embodiments but should be determined by not only the appended claims but also the equivalents thereof.

It should be noted that the description of the foregoing embodiments of the electronic device may be similar to that of the foregoing method embodiments, and the device embodiments have the same beneficial effects as those of the method embodiments. Therefore, details may not be described herein again. For technical details not disclosed in the embodiments of the electronic device of the present disclosure, those skilled in the art may understand according to the method embodiments of the present disclosure.

In the several embodiments provided in the present disclosure, it should be understood that the disclosed device and method may be realized in other manners. The device embodiments described above are merely exemplary. All functional modules or units in the embodiments of the present disclosure may all be integrated in one processing unit, or each unit may be used as a single unit. Two or more units may be integrated in one. The above integrated unit can either be implemented in the form of hardware, or in the form of hardware combined with software functional units.

Persons of ordinary skill in the art should understand that, all or a part of steps of implementing the foregoing method embodiments may be implemented by related hardware of a computer instruction program. The instruction program may be stored in a computer-readable storage medium, and when executed, a processor executes the steps of the above method embodiments as stated above. The foregoing storage medium may include various types of storage media, such as a removable storage device, a read only memory (ROM), a random-access memory (RAM), a magnetic disk, or any media that stores program code.

Alternatively, when the above-mentioned integrated units of the present disclosure are implemented in the form of a software functional module being sold or used as an independent product, the integrated unit may also be stored in a computer-readable storage medium. Based on this understanding, the technical solutions provided by the embodiments of the present disclosure essentially or partially may be embodied in the form of a software product stored in a storage medium. The storage medium stores instructions which are executed by a computer device (which may be a personal computer, a server, a network device, or the like) to realize all or a part of the embodiments of the present disclosure. The above-mentioned storage medium may include various media capable of storing program codes, such as a removable storage device, a read only memory (ROM), a random-access memory (RAM), a magnetic disk, or an optical disk.

Logic when implemented in software, can be written in an appropriate language such as but not limited to C # or C++, and can be stored on or transmitted through a computer-readable storage medium (e.g., that is not a transitory signal)

such as a random access memory (RAM), read-only memory (ROM), electrically erasable programmable read-only memory (EEPROM), compact disk read-only memory (CD-ROM) or other optical disk storage such as digital versatile disc (DVD), magnetic disk storage or other magnetic storage devices including removable thumb drives, etc.

The foregoing descriptions are merely embodiments of the present disclosure, and the protection scope of the present disclosure is not limited thereto. The scope that anyone skilled in the art may easily conceive changes and substitutions within the technical scope disclosed in the present disclosure that should be covered by the present disclosure. Therefore, the protection scope of the present disclosure should be subject to the scope of the claims as listed in the following.

Other embodiments of the disclosure will be apparent to those skilled in the art from consideration of the specification and practice of the disclosure provided herein. It is intended that the specification and examples be considered as exemplary only, with a true scope and spirit of the disclosure being indicated by the claims.

What is claimed is:

1. An evaporative cooling system, comprising:
a heat conducting device, the heat conducting device being capable of coupling to a heating element to be cooled and the heat conducting device comprising a first medium;
a heat dissipating device having one or more heat dissipating outlets;
an evaporator disposed in the heat dissipating device and arranged in relation to the heat conducting device that is arranged at least partially outside the heat dissipating device, wherein:
the heat conducting device further comprises an evaporation chamber disposed inside a heat generating device having the heating element and a condensation chamber disposed above the evaporation chamber and extending out of the heat generating device to connect with an evaporator, the evaporation chamber and the condensation chamber being in communication with each other; and
the heat dissipating device comprises an importing device configured to import a second medium in a liquid state into the evaporator, the import device including a liquid inlet tube extending through a wall of the heat dissipating device and a liquid inlet port formed at an end of the inlet tube of the heat dissipating device, and the evaporator is configured to receive heat from the heat conducting device to evaporate the second medium of the heat dissipating device and discharge the heat from the one or more heat dissipating outlets of the heat dissipating device.

2. The system according to claim 1, wherein:
the evaporation chamber is capable of coupling to the heating element and contains the first medium, and the first medium is heated and flows to the condensation chamber; and the condensation chamber condenses the heated first medium, and returns the first medium to the evaporation chamber.

3. The system according to claim 2, wherein the inner walls of the evaporation chamber and the condensation chamber include a capillary structure to direct the first medium liquefied in the condensation chamber to the evaporation chamber.

4. The system according to claim 1, wherein the heat conducting device is arranged in relation to the evaporator through a pipe.

5. The system according to claim 1, wherein the evaporator is of one or more of the following structures: an S-shaped structure, a grid structure, a plate structure, and a honeycomb structure.

6. The system according to claim 1, wherein the one or more heat dissipating outlets of the heat dissipating device are arranged in relation to an enclosed channel for discharging the heated second medium.

7. An evaporative cooling method, comprising:
transferring heat by a heat conducting device, the heat conducting device being capable of coupling to a heating element to be cooled and the heat conducting device comprising a first medium;
dissipating heat by a heat dissipating device having one or more heat dissipating outlets;
receiving heat by an evaporator disposed in the heat dissipating device and arranged in relation to the heat conducting device that is arranged at least partially outside the heat dissipating device, the heat dissipating device comprises an importing device configured to import a second medium in a liquid state into the evaporator, the import device including a liquid inlet tube extending through a wall of the heat dissipating device and a liquid inlet port formed at an end of the inlet tube of the heat dissipating device; and
evaporating, by the evaporator, the second medium of the heat dissipating device with the heat received from the heat conducting device and discharging the heat by the evaporator from the one or more heat dissipating outlets of the heat dissipating device, wherein:
the heat conducting device further comprises an evaporation chamber disposed inside a heat generating device having the heating element and a condensation chamber disposed above the evaporation chamber and extending out of the heat generating device to connect with an evaporator, the evaporation chamber and the condensation chamber being in communication with each other.

8. The method according to claim 7, wherein the heat conducting device further comprising:
the evaporation chamber being capable of coupling to the heating element and containing the first medium, and the first medium being heated and flowing to the condensation chamber; and the condensation chamber being arranged in relation to the evaporator, condensing the heated first medium, and returning the first medium to the evaporation chamber.

9. The method according to claim 7, wherein the inner walls of the evaporation chamber and the condensation chamber include a capillary structure to direct the first medium liquefied in the condensation chamber to the evaporation chamber.

10. The method according to claim 7, wherein the heat conducting device is arranged in relation to the evaporator through a pipe.

11. The method according to claim 7, wherein the evaporator is of one or more of the following structures: an S-shaped structure, a grid structure, a plate structure, and a honeycomb structure.

12. An apparatus comprising a cooling system, the cooling system comprising:
a heat conducting device, the heat conducting device being capable of coupling to a heating element to be cooled, and the heat conducting device comprising a first medium;
a heat dissipating device having one or more heat dissipating outlets, and an evaporator disposed in the heat dissipating device and arranged in relation to the heat conducting device that is arranged at least partially outside the heat dissipating device; wherein:

the heat conducting device further comprises an evaporation chamber disposed inside a heat generating device having the heating element and a condensation chamber disposed above the evaporation chamber and extending out of the heat generating device to connect with an evaporator, the evaporation chamber and the condensation chamber being in communication with each other; and the heat dissipating device comprises an importing device configured to import a second medium in a liquid state into the evaporator, the importing device including a liquid inlet tube extending through a wall of the heat dissipating device and a liquid inlet port formed at an end of the inlet tube of the heat dissipating device, and the evaporator is configured to receive heat from the heat conducting device to evaporate the second medium of the heat dissipating device and discharge the heat from the one or more heat dissipating outlets of the heat dissipating device.

13. The apparatus according to claim 12, wherein:

the evaporation chamber is capable of coupling to the heating element and contains the first medium, and the first medium is heated and flows to the condensation chamber;

the condensation chamber condenses the heated first medium, and returns the first medium to the evaporation chamber.

\* \* \* \* \*